United States Patent
Horikoshi

(10) Patent No.: US 9,341,943 B2
(45) Date of Patent: May 17, 2016

(54) PELLICLE FOR LITHOGRAPHY

(71) Applicant: SHIN-ETSU CHEMICAL CO., LTD., Tokyo (JP)

(72) Inventor: Jun Horikoshi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/645,856

(22) Filed: Mar. 12, 2015

(65) Prior Publication Data

US 2015/0286133 A1 Oct. 8, 2015

(30) Foreign Application Priority Data

Apr. 2, 2014 (JP) .................................. 2014-75903
Jan. 19, 2015 (JP) .................................... 2015-7450

(51) Int. Cl.
*G03F 1/64* (2012.01)
*G03F 1/62* (2012.01)
*G03F 7/20* (2006.01)
*G03F 1/00* (2012.01)
*G03F 1/22* (2012.01)

(52) U.S. Cl.
CPC *G03F 1/64* (2013.01); *G03F 1/142* (2013.01); *G03F 1/22* (2013.01); *G03F 1/62* (2013.01); *G03F 7/2002* (2013.01)

(58) Field of Classification Search
CPC .............. G03F 1/142; G03F 1/62; G03F 1/64
USPC ........................................................... 430/5
See application file for complete search history.

(56) References Cited

U.S. PATENT DOCUMENTS

| 4,878,973 A | 11/1989 | Ohtake et al. |
| 5,436,061 A | 7/1995 | Hanneman et al. |
| 6,623,893 B1 | 9/2003 | Levinson et al. |
| 2011/0235016 A1* | 9/2011 | Shirasaki ......................... 355/75 |
| 2013/0003036 A1* | 1/2013 | Akiyama et al. ................ 355/72 |
| 2014/0170535 A1 | 6/2014 | Yano et al. |

FOREIGN PATENT DOCUMENTS

| EP | 2568336 A2 | 3/2013 |
| JP | 58-219023 A | 12/1983 |
| JP | 63-27707 A | 2/1988 |
| JP | 5285185 B2 | 9/2013 |
| WO | 2012157759 A1 | 11/2012 |

OTHER PUBLICATIONS

European Search Report dated Nov. 23, 2015, issued in counterpart European Application No. 15156223.8-1560/2927746 (10 pages).
Products Guide—Highly reliable silicone RTV adhesive for fixing electronic component for space development KE-4908SC-T/KE-4908SC-W; No. 90 summer Issue, Issued in Jul. 2002, with English translation (4 pages).
Highly reliable silicone potting agent for space development KE-101A/B; No. 90 summer Issue, Issued in Jul. 2002, with English translation (4 pages).
Intellectual Property Office, Ministry of Economic Affairs Notification of Opinion on Examination with English translation. (9 pages).

* cited by examiner

*Primary Examiner* — Christopher Young

(74) *Attorney, Agent, or Firm* — Westerman, Hattori, Daniels & Adrian, LLP

(57) ABSTRACT

There is provided a pellicle having a frame 12, a film 11 and an adhesive 13 for bonding the film 11 to the frame 12, and this adhesive 13 is a silicone compound having a low outgassing tendency and high heat resistance; in a better mode case, it can maintain its adhesive strength at temperatures 100-200 degrees C. and it exhibits results of TML being 1.0% or lower and CVCM being 0.1% or lower when tested in accordance with ASTM E595-93; thus this pellicle is useful for EUV light exposure lithography.

3 Claims, 1 Drawing Sheet

PELLICLE FOR LITHOGRAPHY

The present non-provisional application claims priority under 35 U.S.C. §119(a) from Japanese Patent Applications No. 2014-75903 filed on Apr. 2, 2014 and No. 2015-007450 filed on Jan. 19, 2015, the entire disclosure of which is hereby incorporated herein by reference.

FIELD OF THE INVENTION

The present invention relates to a pellicle which can be employed in a kind of lithography wherein EUV (Extreme Ultra Violet) light typically having a dominant wavelength of 13.5 namometers is used, and the invention significantly is relevant to a pellicle where an adhesive having a low outgassing tendency is used.

TECHNICAL BACKGROUND OF THE INVENTION

In manufacturing semiconductor devices such as LSI and super-LSI or in manufacturing a liquid crystal display board or the like, a pattern is made by irradiating a light to a semiconductor wafer or an original plate for liquid crystal, but if a dust is attached a photo mask or a reticle (hereinafter collectively referred to as "photo mask" for simplicity) which is used during the irradiation operation, the dust causes the pattern to have roughened edges or black stains on a base, and thus leads to problems such as damaged dimensions, poor quality, and deformed external appearance.

Thus, these works are usually performed in a clean room, but it is still difficult to keep the photo mask clean all the time. Therefore, a pellicle is attached to a surface of the photo mask as a dust-fender before photo irradiation is carried out. Under such circumstances, foreign substances do not directly adhere to the surface of the photo mask but adhere only to the pellicle film, which is sufficiently away from the photo mask surface so that by setting a photo focus on a lithography pattern on the photo mask, the foreign substances on the pellicle film fail to transfer their shadows on the photo mask and thus no longer become a cause for problems to the image transfer performance.

In general, a pellicle is made by tensely adhering a transparent pellicle film made of a highly light transmitting material such as cellulose nitrate, cellulose acetate, fluorine-containing polymer and the like to one of the two annular frame faces of a pellicle frame made of aluminum, stainless steel, polyethylene or the like, using as the glue either a solvent capable of dissolving the pellicle film, which is applied to said annular frame face (hereinafter this face is called "upper frame face") and then air-dried before receiving the film (ref. IP Publication 1), or an adhesive such as acrylic resin, epoxy resin or the like (ref. IP Publication 2). The other annular frame face (hereinafter called "lower frame face") of the pellicle frame is paved with an agglutinant made of polybutene resin, polyvinyl acetate resin, acrylic resin, silicone resin or the like for attaching the pellicle frame to a photo mask, and over this agglutinant layer is laid the release liner (tape) to protect the agglutinant layer.

In a case wherein, after a pellicle such as the kind explained above is adhered to a face of a photo mask, a photo resist film formed on a semiconductor wafer or an original plate for making a liquid crystal panel is exposed to a light via the photomask, a foreign matter such as dust is caught on the pellicle surface and thus is prevented from reaching the surface of the photo mask so that it is possible to avoid the effect of the foreign particle such as dust if the exposure light is emitted in a manner such that the focus occurs at the pattern formed on the photo mask.

In recent years, the semiconductor devices and the liquid display board have undergone further heightening in integration and densification. Currently, a lithographic patterning on the density level of 32 nm is on the verge of realization. Such patterning can be effectively achieved by improved technologies such as immersion exposure method and double exposure method, which use a conventional argon fluoride (ArE) exmimer lasar, to which the photo resist film is exposed.

However, the next-generation semiconductor devices and the liquid display board are being demanded to have even denser patterning of a level of 10 nm or further, and the exposure technology depending on excimer laser no longer can improve itself to answer the demand of making such a dense pattern of the level of 10 nm or denser.

Now, as a most promising method for forming a pattern of a density of 10 nm or denser, an EUV exposure technology which uses an EUV light of a dominant wavelength of 13.5 mm is in the spotlight. To achieve a pattern formation on the density level of as high as 10 nm or denser on the photoresist film, it is necessary to solve the technical problems with regard to the choices of light source, photoresist, pellicle, etc., and in respect of light source and photoresist there have been considerable progresses and various proposals have been made.

With respect to a pellicle that improves yields of semiconductor device products or liquid crystal displays, IP Publication 3 discloses a silicon film of a thickness of 0.1-2.0 micrometers to act as a pellicle film for EUV lithography which is transparent and does not give rise to optical distortion; however there remain problems unsolved yet which still prevent realization of the EUV light exposure technology.

PRIOR ART PUBLICATIONS

Publications

[IP Publication 1]
Japanese Patent Application Publication S58[1983]-219023
[IP Publication 2]
Japanese Pre-Patent Publication for Public Review S63 [1988]-27707
[IP Publication 3]
U.S. Pat. No. 6,623,893

SUMMARY OF THE INVENTION

Problems the Invention Seeks to Solve

In respect of materials to make the adhesive for bonding the pellicle film to the pellicle frame, the selection has been made solely based on the adhesive strength of them in the case of conventional lithography where the exposure lights used were i-line (wavelength of 365 nm), krypton fluoride (KrF) excimer laser (wavelength of 248 nm), or argon fluoride (ArF) excimer laser (wavelength of 193 nm); however in the case of the EUV exposure light lithography, where a pattern of a fineness order of 10 nm or smaller is printed on the photoresist film, it is necessary to maintain the light exposure chamber evacuated, which causes the conventionally used adhesives to give away outgasses, which are liable to pollute the pellicle film and photo mask with a problematic result that the fine patterning is not obtained. Also, for example, in the EUV light exposure lithography, the temperature of the pellicle rises due to the energy of the exposure light during the lithography operation, so that the adhesive need be able to withstand such high temperature.

Accordingly, the present invention was contrived in view of these problems, and it is an object of the invention to provide an adhesive for pellicle which is less liable to give away outgas which pollutes the pellicle film and photo mask and is resistive to high temperatures, and also the invention provides a pellicle using such adhesive.

In order to attain these objects, the inventor searched hard and came to focus on silicone compound adhesives among many other kinds of adhesives, and conducted comparative tests and found that such silicone compound adhesives that exhibit, under conditions in accordance with ASTM E595-93, the results of TML being 1.0% or lower and CVCM being 0.1% or lower, have low outgassing property and reasonably high heat resistance, so that the inventor considered they are especially favorable for EUV exposure light lithography, and thus possessed the invention.

Means to Solve the Problems

Therefore, the present invention proposes an adhesive for bonding the pellicle film on the pellicle frame, made of silicone compound which has such a low outgassing property that the outgas amount of the adhesive exhibits the results of TML being 1.0% or lower and CVCM being 0.1% or lower, when tested in accordance with the method specified by ASTM E595-93. Herein, TML is the total mass loss as defined in ASTM E595-93. CVCM is the collected volatile condensable materials as defined in ASTM E595-93.

Furthermore, for adhering the pellicle film to the pellicle frame, the pellicle of the present invention uses an adhesive which satisfies the above-described requirements, and thus it is especially useful for an application wherein it is subjected to a temperatures of 100 through 200 degrees C. during the EUV light exposure, and thus it is preferable that the pellicle of the present invention uses an adhesive which is resistive to high temperatures of 100 through 200 degrees.

Effect of the Invention

With the adhesive of the present invention, which can resist temperatures of 100 degrees C. or higher, it is possible to suppress outgassing from the adhesive as well as degradation of the adhesive when the pellicle is exposed to a vacuum in the light exposure chamber at an elevated temperature during the EUV light exposure lithographic operation so that the pellicle film and the photo mask are not polluted; hence it is possible to form a densified pattern as fine as 10 nanometers or smaller.

EXAMPLES TO EMBODY THE INVENTION

We will now explain in detail with reference to the drawings how the present invention can be embodied, but the invention is not limited to such embodiments.

Figure 1:
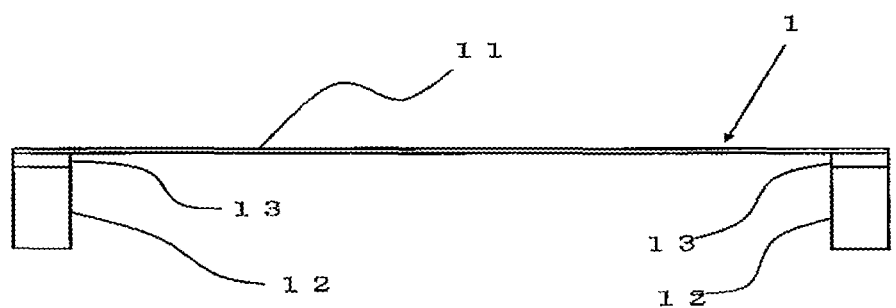
FIG. 1
A longitudinal cross section of the pellicle of the present invention in which low outgassing adhesive is used.

FIG. 1 is a longitudinal cross section of an example of the pellicle of the present invention, in which low outgassing adhesive 13 is used. The pellicle 1 has a pellicle frame 12, which ordinarily has a quadrilateral shape (rectangular or square) to meet the shape of the base plate (photo mask or its glass substrate part), not shown, to which the pellicle 1 is to be affixed, and a pellicle film 11 is tensely adhered to the upper frame face of the pellicle frame 12 by means of an adhesive 13. Also an agglutinant layer 13 is provided to the lower face of the frame 12 by which the pellicle is agglutinated to the base plate, and a liner 14 is releasably attached to the agglutinant's lower face so as to protect the agglutinant layer 13.

Now, there is no particular limitation as to the materials of the pellicle film 11 and the pellicle frame 12, and any known materials may be used. It is preferable however that the pellicle film 11 is made of a material that passes the EUV light at a high rate and examples include monocrystal silicon, polycrystal silicon and amorphous silicon. It is possible to provide a protective film to the pellicle film 11 so as to protect the latter, and such protective film may be made of SiC, $SiO_2$, $Si_3N_4$, SiON, $Y_2O_3$, YN, Mo, Ru, Rh or the like. It is preferable that the pellicle frame 12 is made of a metal for the reasons of heat radiation, machinability, and strength.

The low outgassing adhesive 13 of the present invention, which is laid endlessly on the upper frame face of the pellicle frame 12, is to adhere the pellicle film 11 to the pellicle frame 12. The adhesive 13 of the present invention is only effectively non-outgassing if it is made of a silicone compound which meets, in accordance with ASTM E595-93, the tests of TML being 1.0% or lower and CVCM being 0.1% or lower, and thus it makes an acceptable adhesive, unlike other silicone compounds, for the purpose of EUV exposure lithography.

[Test Conditions of ASTM E595-93]
Degree of vacuum: $7.0 \times 10^{-5}$ Torr or lower
Temperature of heating rod: 125 degrees C.
Temperature of collector plate: 25 degrees C.
Test time: 24 hours
Herein, TML is the total mass loss as defined in ASTM E595-93. CVCM is the collected volatile condensable materials as defined in ASTM E595-93.

An example of such low outgassing silicone compound adhesive that satisfies the above-stated requirements is KE-101A/B (a product name) which is a silicone compound manufactured by Shin-Etsu Chemical Co., Ltd. This compound KE-101A/B releases only a lesser amount of outgas and is heat resistive; hence it is a preferable choice. This KE-101A/B is of a two-liquid room temperature curable type, but the adhesive 13 of the present invention can be otherwise, and it can be of a one-liquid heat curable type or a ultraviolet ray curable type.

The adhesive 13 of the present invention is especially useful in an EUV pellicle, which is normally subjected to a temperature as high as 100 through 200 degrees C. when it is exposed to the exposure light energy during the EUV light exposure lithographic operation. Hence it is preferable that the adhesive 13 of the present invention is resistant to such high temperatures.

The silicone compound adhesive KE-101A/B, which satisfies the above-mentioned requirements regarding non-outgassing property, was subjected to a heat-resistance test, wherein the pellicle 1 was let to sit in an atmosphere of 150 degrees C. for 24 hours in an oven and was cooled to the room temperature, and the adhesion quality (film tension) of the pellicle film 11 was inspected. And it was confirmed that the pellicle film 11 stayed tensely bonded on the pellicle frame. It was confirmed therefore that the adhesive 13 of the present invention can maintain a sufficient adhesive strength after a subjection to the high temperature of 150 degrees C.

The same test was conducted except that KE-4908SC-T (a silicone product of Shin-Etsu Chemical Co., Ltd), which satisfies the above-mentioned requirements regarding non-outgassing property, was used and the atmosphere in the oven was heated to a temperature of 200 degrees C.; and the resultant adhesion quality was as good as in the foregoing case.

From these heat resistance tests, it was confirmed that some of the silicone adhesives of the present invention, which satisfy the above-mentioned requirements regarding non-outgassing property, are effectively heat resistant and thus retain adhesive strength at temperatures from 100 through 200 degrees C.; hence it was confirmed that they can be used as the adhesive for an EUV pellicle which is subjected to temperatures of 100 through 200 degrees C. during EUV light exposure.

Figure 2:
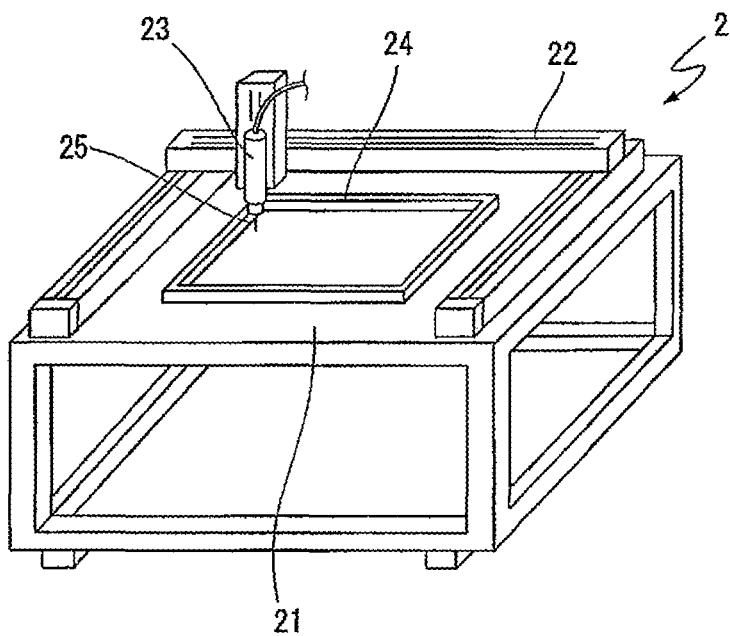
FIG. 2
A schematic perspective view of an adhesive application apparatus which can be employed for the purpose of the present invention.

It is possible to lay this kind of low outgassing and heat resistive adhesive 13 on the pellicle frame 12 by means of an application apparatus such as the one shown in FIG. 2. FIG. 2 is a schematic drawing of an example of an adhesive application apparatus suitable for laying the adhesive 13. This adhesive application apparatus 2 is mounted on a base table 21 via a triaxial robot 22, which is composed of a stationary rail and a movable rail, which are adapted to allow a syringe 23 to move in X-axis, Y-axis, and Z-axis directions. A hollow needle 25 is attached to an end of this syringe 23, which can be filled with the adhesive 13 and is connected to an air pressurization type dispenser (not shown), and, therefore, it is possible to control the position of the needle 25 three-dimensionally, by virtue of a controller (not shown) controlling the movement of the triaxial robot 22, and the discharge rate of the adhesive 13 simultaneously.

Thus, the needle 25 moves over the upper frame face of the pellicle frame 24, which is set on the base table 21 of the adhesive application apparatus 2, while feeding the adhesive 13, whereby the adhesive 13 is laid on the upper frame face of the pellicle frame 24. The means for transporting the syringe 23 (not shown) may be a kind driven by pressurized gas such as air and nitrogen, or a kind driven by syringe pump, plunger pump, tube pump, or any of other various transportation means capable of controlling the feed rate and the timing of feeding and non-feeding.

When the viscosity of the adhesive 13 is so high that it is difficult to conduct smooth application of the adhesive 13, it is recommended to add to it an aromatic solvent such as toluene or xylene, or an aliphatic solvent such as hexane, octane, iso-octane, or iso-paraffine, or a ketone-based solvent such as methyl ethyl ketone or methyl isobutyl ketone, or an ester-based solvent such as ethyl acetate or butyl acetate, or an ether-based solvent such as di-isopropyl ether or 1,4-dioxane, or a mixture of two or more of these.

EXAMPLES

Next, we will explain the present invention concretely by using examples and comparative examples.

Example 1

In Example 1, at first, a rectangular pellicle frame 24 made of an aluminum alloy, of which the outer periphery measured 149 mm×122 mm×5.8 mm (in height) and the thickness 2 mm, was transported into a clean room, where it was washed with a neutral detergent and pure water thoroughly and dried. Thereafter, the pellicle frame 24 was fixed on the base table 21 of the adhesive application apparatus 2, as shown in FIG. 2.

In Example 1, the low outgassing adhesive 13 used was the silicone compound KE-101A/A (a product manufactured by Shin-Etsu Chemical Co., Ltd.). This KE-101A/B is of two-liquid room temperature curing type, and KE-101A and KE-101B were measured in an equivalent weight, respectively, and were mixed by stirring sufficiently.

Next, a polypropylene (PP) syringe 23 of the adhesive application apparatus 2, shown in FIG. 2, was filled with the thus prepared adhesive 13, and this syringe 23 was connected to an air pressurization type dispenser (not shown; manufactured by Iwashita Engineering, Inc.). In this adhesive application apparatus 2, the triaxial robot 22 was controlled by its controller (not shown) to effect automatic robotic movement and adhesive discharge so that an endless application of the adhesive 13 via the needle 25 on the upper frame face of the pellicle frame 14 was completed automatically.

Thereafter, the pellicle film 1 was adhered to the upper frame face of the pellicle frame 24, and the extra portion of the film that extended beyond the frame was trimmed off by a cutter. In Example 1, the adhesive 13 was cured by letting it sit at a room temperature (25 degrees C.) for 24 hours, but it is possible to raise the temperature so as to shorten the curing time.

Example 2

In Example 2, except that a silicone compound KE-4908SC-T (product name; manufactured by Shin-Etsu Chemical Co., Ltd.) was used as the adhesive 13, a pellicle 1 was made in the same manner as in Example 1.

Comparative Example 1

In Comparative Example 1, except that an epoxy-based compound Araldite AW-106 (product name; manufactured by Nihon Ciba-Geigy K. K.) was used as the adhesive 13, a pellicle 1 was made in the same manner as in Example 1.

Comparative Example 2

In Comparative Example 2, except that an epoxy acrylate-based compound OPTDYNE UV-3100 (product name; manufactured by DAIKIN INDUSTRIES, Ltd.) was used as the adhesive 13, a pellicle 1 was made in the same manner as in Example 1.

Next, with respect to Examples 1 and 2 and Comparative Examples 1 and 2, the respective adhesives 13 were evaluated for their outgassing and heat resistive properties.

[Outgas Test]

The tests conditions of the evaluation of outgassing property of the adhesives 13 used in Examples 1 and 2 and Comparative Examples 1 and 2, are as follows.

[Test Conditions of ASTM E595-93]

Degree of vacuum: $7.0 \times 10^{-5}$ Torr or lower

Temperature of heating rod: 125 degrees C.

Temperature of collector plate: 25 degrees C.

Test time: 24 hours

[Heat Resistance Test]

Each one of the pellicle 1 made in Examples 1 and 2 and Comparative Examples 1 and 2 was let to sit in an atmosphere of 150 degrees C. in an oven for 24 hours, and was cooled to the room temperature, and the adhesion quality (film tension) of the pellicle film 11 was inspected.

The results of the outgas test and the heat resistance test are as shown in Table 1.

TABLE 1

|  | Result of outgas test (TML: %) | Pellicle film quality after heat resistance test | total rating |
|---|---|---|---|
| Example 1 | 0.4 | good | good |
| Example 2 | 0.6 | good | good |
| Comparative Example 1 | 4.9 | good | no good |
| Comparative Example 2 | 0.4 | no good (pellicle film was slacken) | no good |

The results in Table 1 show that in the cases of the adhesives of Examples 1 and 2 the outgas amounts were suppressed to 0.4% and 0.6%, respectively, and the tenseness of the pellicle films was good so that it was confirmed that these adhesives did not suffer loss of the adhesive strength at high temperatures and thus heat resistive. On the other hand, in the case of the adhesive of Comparative Example 1, the outgas amount was as high as 4.9%, but it helped to maintain the tenseness of the pellicle film. As for the adhesive of Comparative Example 2, the outgas amount was 0.4%, which is within the requirement range, but there was a slack in the pellicle film so that it was confirmed that this adhesive fails with respect to heat resistance.

Therefore, it was confirmed that the adhesives made of silicone compounds KE-101A/B, KE-4908SC-T or the like are excellent in non-outgassing property and heat resistance, so that they would make a good adhesive for use in EUV exposure lithography in more than one respect.

EXPLANATION FOR REFERENCE NUMERALS

1: pellicle
11: pellicle film
12: pellicle frame
13: adhesive
14: adhesive application apparatus
21: base table
22: triaxial robot
23: syringe
24: pellicle frame
25: needle

What is claimed is:
1. A pellicle comprising
a pellicle frame,
a pellicle film and
an adhesive for bonding said pellicle film on said pellicle frame,
wherein said adhesive is a silicone compound which exhibits results of total mass loss (TML) being 1.0% or lower and collected volatile condensable materials (CVCM) being 0.1% or lower when tested in accordance with a method specified by ASTM E595-93.
2. A pellicle as claimed in claim 1, wherein said adhesive maintains effective adhesive strength at 100 through 200 degrees C. for at least 24 hours.
3. A pellicle as claimed in claim 1, wherein said pellicle is for EUV light exposure lithography in which the pellicle is subjected to temperatures of 100 through 200 degrees C.

* * * * *